(12) United States Patent
Davidoff et al.

(10) Patent No.: US 7,526,052 B2
(45) Date of Patent: Apr. 28, 2009

(54) CONFIGURABLE FILTER AND RECEIVER INCORPORATING SAME

(75) Inventors: Loan T. Davidoff, Marina Del Rey, CA (US); Howard S. Nussbaum, Los Angeles, CA (US); Jackson Y. Chia, San Gabriel, CA (US)

(73) Assignee: Raytheon Company, Waltham, MA (US)

( * ) Notice: Subject to any disclaimer, the term of this patent is extended or adjusted under 35 U.S.C. 154(b) by 730 days.

(21) Appl. No.: 11/021,352

(22) Filed: Dec. 21, 2004

(65) Prior Publication Data

US 2006/0133551 A1 Jun. 22, 2006

(51) Int. Cl.
H04B 1/10 (2006.01)

(52) U.S. Cl. .................... 375/350; 375/316; 708/300; 708/309; 708/322; 455/130; 455/142; 455/144; 329/315; 329/347; 329/372

(58) Field of Classification Search ............... 375/350; 708/300–714

See application file for complete search history.

(56) References Cited

U.S. PATENT DOCUMENTS

| | | | |
|---|---|---|---|
| 2,409,474 A | | 10/1946 | Clapp |
| 5,732,337 A | * | 3/1998 | Wargnier et al. ............. 455/144 |
| 5,859,878 A | | 1/1999 | Phillips et al. |
| 5,870,402 A | * | 2/1999 | Kelley ......................... 370/497 |
| 5,929,896 A | * | 7/1999 | Goodman et al. ......... 348/14.12 |
| 5,952,947 A | * | 9/1999 | Nussbaum et al. ........... 341/143 |
| 6,256,358 B1 | * | 7/2001 | Whikehart et al. ........... 375/316 |
| 6,307,868 B1 | * | 10/2001 | Rakib et al. .................. 370/485 |
| 2001/0043116 A1 | * | 11/2001 | Waltman ..................... 327/559 |
| 2004/0162023 A1 | * | 8/2004 | Cho ............................ 455/41.1 |
| 2004/0246074 A1 | * | 12/2004 | Humphrey ................... 333/174 |
| 2005/0048928 A1 | * | 3/2005 | Jeon et al. ...................... 455/78 |
| 2005/0201501 A1 | * | 9/2005 | Yoon ........................... 375/350 |

(Continued)

FOREIGN PATENT DOCUMENTS

DE 92 06 123 U1 9/1992

(Continued)

*Primary Examiner*—Chieh M Fan
*Assistant Examiner*—Siu M Lee

(57) ABSTRACT

An efficient configurable signal filter. The filter includes a first mechanism for receiving a first signal of a first type and a second signal of a second type. A second mechanism selectively filters the first signal during a first mode of operation, and filters the second signal during a second mode of operation. A third mechanism generates control signals. A fourth mechanism automatically configures the second mechanism to operate in the first mode of operation or the second mode of operation based on the control signals. In a specific embodiment, the first type of signal is characterized by a first rate, and the second type of signal is characterized by a second rate. The first signal and the second signal are digital ADC outputs. The second mechanism includes plural filter blocks, each having one or more Multiply-Accumulate (MAC) pipes. Each of the one or more MAC pipes include one or more MAC blocks that are each associated with a coefficient memory data structure of a coefficient memory. The third mechanism or a user selects coefficients from each memory data structure to apply to each MAC block, thereby selectively affecting filter response. The control signals direct multiplexers or switches to configure the MAC pipes in a serial configuration or a parallel configuration corresponding to the first mode of operation or the second mode of operation, respectively.

32 Claims, 6 Drawing Sheets

U.S. PATENT DOCUMENTS

2005/0220218 A1 * 10/2005 Jensen et al. ................ 375/302

FOREIGN PATENT DOCUMENTS

| DE | 92 06 124 U1 | 9/1992 |
| DE | 41 18 384 A1 | 12/1992 |
| EP | 1 071 216 S | 1/2001 |
| GB | 2 170 358 A | 7/1986 |

* cited by examiner under Contract No. F19628-00-C-0100 awarded by the Department of the Air Force. The Government has certain rights in this invention.

BACKGROUND OF THE INVENTION

1. Field of Invention

This invention relates to signal processing. Specifically, the present invention relates to filters, such as digital bandpass filters and accompanying receiver systems.

2. Description of the Related Art

Digital bandpass filters are employed in various demanding applications including digital radar receivers, multimode ladars, and spread spectrum communication systems. Such applications often employ plural bandpass filters to process digital signals at different rates.

A signal processing system may include plural Analog-to-Digital Converters (ADCs), each providing digital outputs at different rates along different signal processing paths. Large and expensive Application-Specific Integrated Circuits (ASICs) or multiple Field-Programmable Gate Arrays (FPGAs) are often required to implement the plural processing paths and accompanying digital filters. These large circuits are particularly problematic in single-module radar receivers, where circuit board space is limited.

Hence, a need exists in the art for a space-efficient filter for replacing the plural digital filters currently employed in various signal processing systems.

SUMMARY OF THE INVENTION

The need in the art is addressed by the efficient configurable signal filter of the present invention. In the illustrative embodiment, the signal filter is a configurable digital filter that is adapted to filter ADC data to produce digital In-phase (I) and Quadrature (Q) signals. This embodiment assumes that the input signals are real. Those versed in the art can extend this to I/Q signals or certain classes of nonuniform real samples. The filter includes a first mechanism for receiving a first signal of a first type and a second signal of a second type. A second mechanism selectively filters the first signal during a first mode of operation and filters the second signal during a second mode of operation. A third mechanism generates a control signal. A fourth mechanism automatically configures the second mechanism to operate in the first mode of operation or the second mode of operation based on the control signal.

In a specific embodiment; the first type of signal is characterized by a first rate; and the second type of signal is characterized by a second rate. The first signal and the second signal are ADC output signals. The second mechanism includes plural filter banks, each filter bank associated with one or more Multiply-Accumulate (MAC) pipes. Each of the one or more MAC pipes include one or more MAC blocks that are each associated with a coefficient memory data structure. The third mechanism includes a controller that facilitates selecting coefficients from each memory data structure to apply to each of the one or more MAC blocks, thereby selectively affecting filter response. The coefficients are user-definable, and the controller is user-configurable via a user interface to the controller.

In a more specific embodiment, each memory data structure is a stack that is responsive to coefficient-control signals from the controller. The coefficient-control signals indicate start addresses and end addresses for sets of coefficients to be applied to the one or more MAC blocks.

The controller provides control signals to one or more multiplexers or switches to control whether the MAC pipes are in a serial configuration or a parallel 5configuration corresponding to the first mode of operation or the second mode of operation, respectively. The parallel configuration is adapted to filter wideband signals, and the serial configuration is adapted to filter narrowband signals. The controller further implements a sixth mechanism for adjusting filter lengths or integration delays associated with the filter. The sixth mechanism includes the multiplexers or switches that are responsive to specific control signals. The specific control signals are configured to selectively switch a desired number of the multiplexers or switches to affect numbers of the MAC pipes that are connected in a serial configuration, thereby affecting filter integration delay during the first mode of operation.

In the specific embodiment, the filter further includes a first filter block and a second filter block, each having two filter banks, one filter bank for producing I signals, and another filter bank for producing Q signals. An I/Q output configuration module selectively combines I and Q signals output by the first filter block and the second filter block into desired filter outputs.

In the specific embodiment, the first rate is a narrowband rate, and the second rate is a wideband rate. The narrowband rate is double a system clock rate, and the wideband rate is eight times the system clock rate. The filter further includes a data-select module that is responsive to control input from the controller. The data-select module allows the first signal, which is a narrowband signal, to pass through the data-select module during the first mode of operation. The data select module imparts an offset of 4×DF (where DF is the input data Decimation Factor) system clock cycles to the second signal, which is a wideband signal, during the second mode of operation. Initiation of integration implemented by the second filter block is delayed by DF/2 relative to initiation of integration implemented by the first filter block. The I/Q output configuration module includes a seventh mechanism for interleaving the even and odd I/Q samples to provide an output rate of 2(system clock rate)/DF when the system is in the second mode of operation and to provide an output rate of (system clock rate)/DF when the system is in the first mode of operation.

The novel design of one embodiment of the present invention is facilitated by the fourth mechanism, which enables the configurable filter to selectively process signals at different input data rates in accordance with appropriate filter responses. Accordingly, the configurable filter may be shared between wideband and narrowband data paths in various signal processors, such as radar receivers. Furthermore, use of shared filtering afforded by various embodiments of the present invention enable smaller receiver designs that may be implemented via a single FPGA rather than several FPGAs. Use of a versatile coefficient memory enables the filter response to be adjusted in accordance with predetermined criteria, such as the operational mode of the system. Furthermore, use of unique configurable filter blocks enables variations in filter integration delays, which enhances filter versatility and programmability.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The following discussion of a conventional receiver is intended to facilitate an understanding of the present invention.

Figure 1:
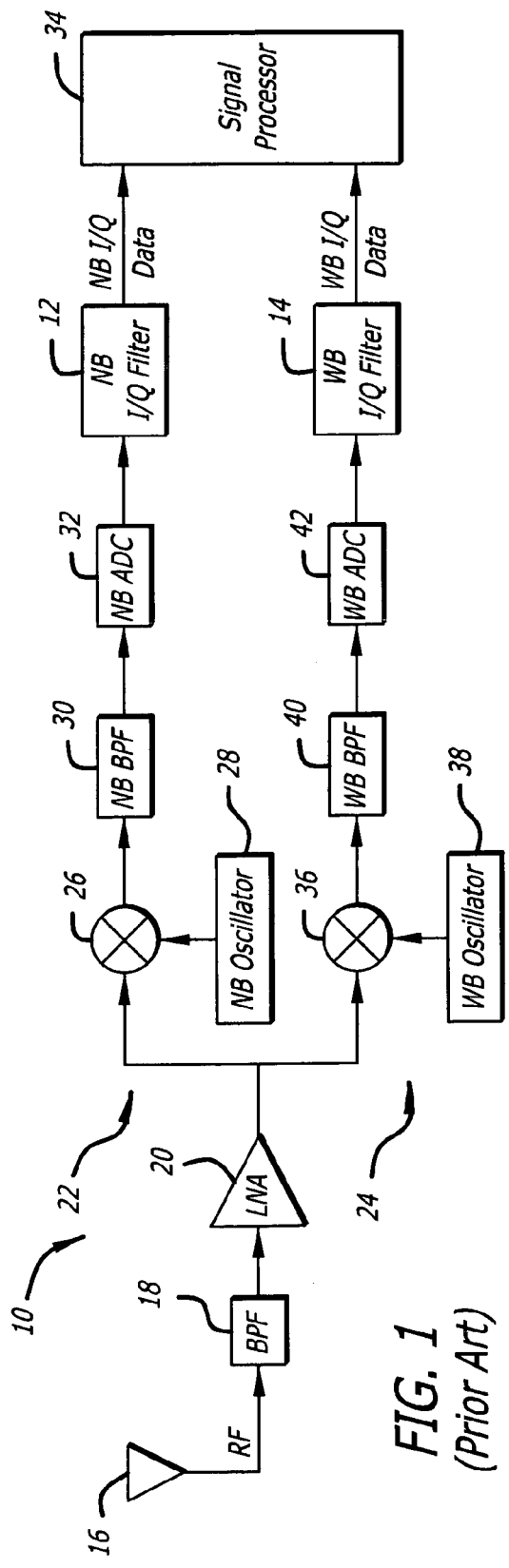
FIG. 1 is a block diagram of a conventional receiver employing different I/Q filters for filtering different signals.

FIG. 1 is a block diagram of a conventional receiver 10 employing a NarrowBand (NB) In-phase and Quadrature (I/Q) filter 12 for filtering narrowband data and a WideBand (WB) I/Q filter 14 for filtering wideband data. The conventional receiver 10 includes, from left to right, a Radio Frequency (RF) antenna 16, a first BandPass Filter (BPF) 18, and Low Noise Amplifier (LNA) 20. The output of the LNA 20 is split along a narrowband path 22 and a wideband band path 24. The narrowband path 22 includes, from left to right, a first mixer 26 that is driven by a narrowband oscillator 28, a narrowband BPF 30, a narrowband Analog-to-Digital Converter (ADC) 32, and the narrowband I/Q filter 12. The output of the narrowband I/Q filter is input to a signal processor 34. The wideband path 24 includes, from left to right, a second mixer 36 that is driven by a wideband oscillator 38, a wideband BPF 40, a wideband ADC 42, and the wideband I/Q filter 14, which provides input to the signal processor 34.

For the purposes of the present discussion, a narrowband signal is a signal sampled at twice the FPGA clock rate, which is the system clock rate. A wideband signal is a signal sampled at eight times the FPGA clock rate.

In operation, the antenna 16 receives RF electromagnetic energy and provides corresponding RF electrical signals to the first BPF 18 in response thereto. The BPF 18 filters the RF signals to suppress undesirable out-of-band energy in the received RF signals. The LNA 20 then amplifies the resulting output of the BPF 18.

Along the narrowband path 22, the output of the LNA 20 is mixed with a reference signal output by the narrowband oscillator 28 via the first mixer 26. The narrowband oscillator 28 is tuned to produce a reference signal at a desired narrowband carrier frequency. The resulting output of the first mixer 26 is a narrowband analog signal. The narrowband analog signal is filtered by the narrowband BPF 30 and then converted to a digital signal via the narrowband ADC 32. The digitized narrowband signal is then filtered by the narrowband I/Q filter 12, which has a predetermined fixed transfer function, i.e., filter response. The resulting filtered narrowband I/Q signal is forwarded to the signal processor 34 for further processing.

Similarly, along the wideband path 24, the output of the LNA 20 is mixed with the output of the wideband oscillator 38 via the second mixer 36. The wideband oscillator 38 is tuned to produce a reference signal at a desired wideband carrier frequency. The resulting output of the second mixer 36 is a wideband analog signal, which is converted to a wideband digital signal via the wideband ADC 42 after bandpass filtering by the wideband BPF 40. The resulting wideband digital signal output by the wideband ADC 42 is then filtered by the wideband I/Q filter, which has a predetermined fixed transfer function. The resulting filtered wideband I/Q signal is input to the signal processor 34 for further processing.

In the conventional receiver 10, digital signal outputs of the narrowband ADC 32 and the wideband ADC 42 are filtered via separate filters 12, 14. Use of the separate filters 12, 14 to filter input data at different rates results in a relatively large circuit, which is problematic in applications where circuit size is important. Furthermore, the relatively large receiver 10 may require expensive Application-Specific Integrated Circuit (ASIC) development or a multiple-FPGA solution that requires extra circuit board space, which may be prohibitive in certain single-module receiver applications. Furthermore, the conventional narrowband I/Q filter 12 and wideband I/Q filter 14 lack significant configurability, which limits the applicability of the receiver 10.

While some receiver applications may employ I/Q filters with programmable coefficients, these applications typically lack filters with variable filter lengths for fine control of integration delays. Furthermore, conventional I/Q filters typically lack coefficient memories capable of accommodating variable numbers of coefficient sets.

Figure 2:
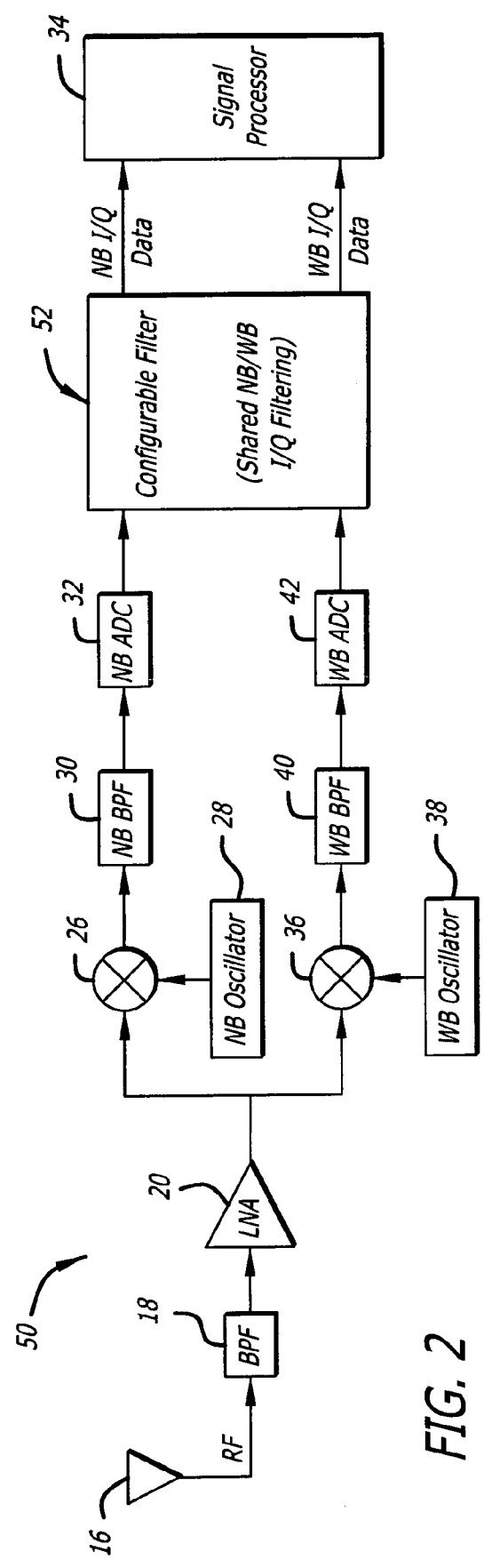
FIG. 2 is a block diagram of a receiver employing a configurable multi-rate filter according to an embodiment of the present invention.

FIG. 2 is a block diagram of a receiver 50 employing a configurable multi-rate filter 52 according to an embodiment of the present invention. For clarity, various well-known components, such as power supplies, clocking circuits, and so on, have been omitted from the figures. However, those skilled in the art with access to the present teachings will know which components to implement and how to implement them to meet the needs of a given application.

The construction and operation of the receiver 50 is similar to the construction and operation of the receiver 10 of FIG. 1 with the exception that the narrowband I/Q filter 12 and the wideband I/Q filter 14 in FIG. 1 are replaced with the single configurable filter 52 in FIG. 2. Unlike the I/Q filters 12, 14 of FIG. 1, the configurable filter 52 supports variable input rates using shared filtering and exhibits controllable filter lengths and a coefficient memory that accommodates variable numbers of coefficient sets with single-clock switching capability as discussed more fully below.

Various embodiments disclosed herein, such as the embodiment shown in FIG. 2, assume that digital input signals to the configurable filter 52 are real-valued signals. Those skilled in the art with access to the present teachings may readily adapt the configurable filter 52 to filter I/Q signals or certain classes of nonuniform real samples without undue experimentation and without departing from the scope of the present invention.

In the present embodiment, the narrowband analog signal output by the narrowband BPF 30 is sampled by the narrowband ADC 32 at twice the system clock rate, which is the clock rate of the Field Programmable Gate Array (not shown) upon which the receiver 50 is implemented. The wideband analog signal output by the wideband BPF 40 is sampled by the wideband ADC 42 at eight times the system clock rate, i.e., the FPGA clock rate.

The various receiver components 18, 20, 26-32, 36-42, 52 between the antenna 16 and the signal processor 34 comprise a receive chain. The configurable filter 52 reduces the size of the receive chain, which is particularly important in single-module radar receivers where circuit board space is particularly limited.

Figure 3:
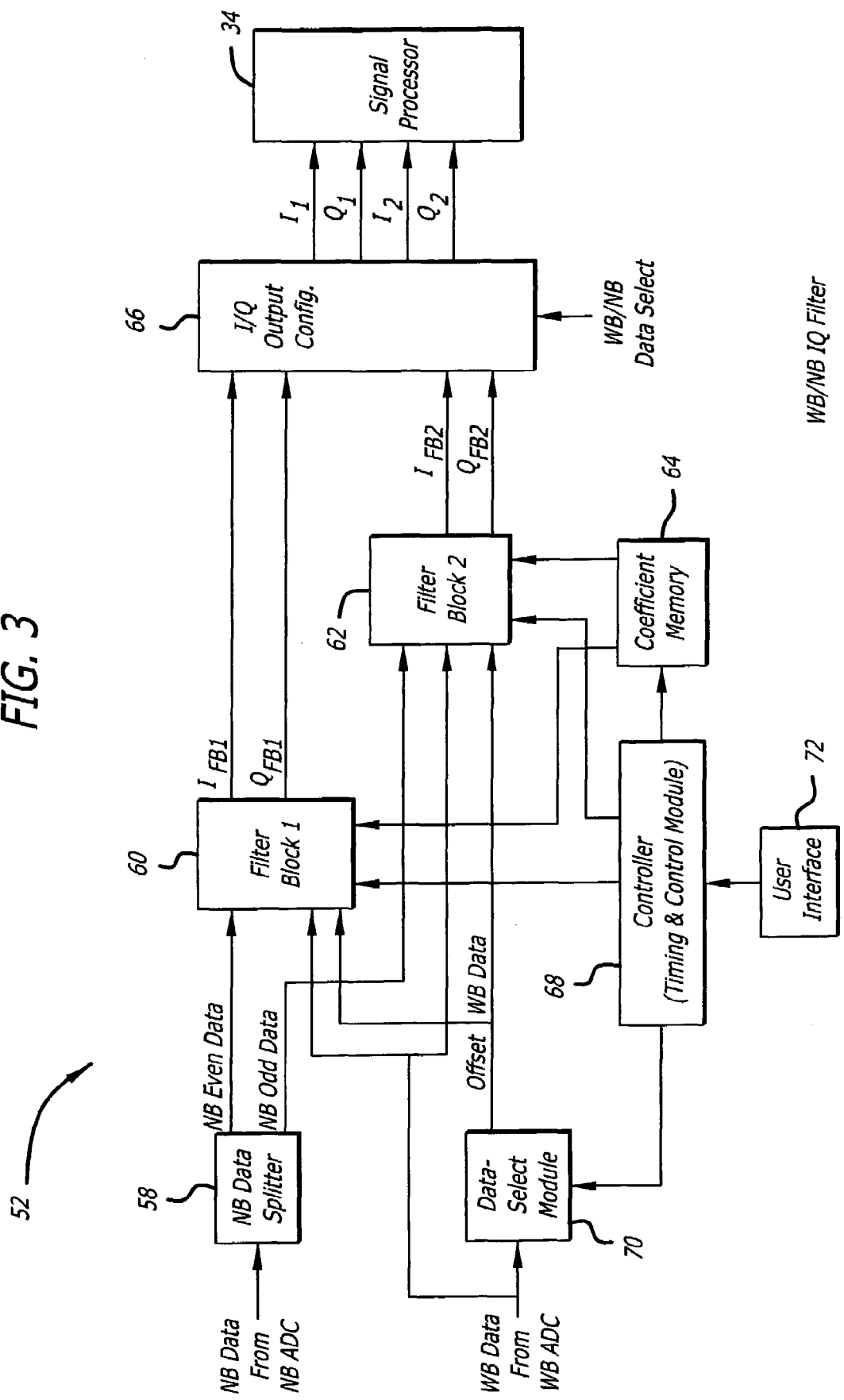
FIG. 3 is a more detailed block diagram of the multi-rate filter of FIG. 2 incorporating versatile filter blocks, a filter coefficient memory, and an I/Q output configuration module.

FIG. 3 is a more detailed block diagram of the multi-rate configurable filter 52 of FIG. 2, which includes versatile filter blocks 60, 62, a filter coefficient memory 64, and an I/Q output configuration module 66. With reference to FIGS. 2 and 3, the narrowband data splitter 58 receives the digital narrowband signal, i.e., narrowband data, from the narrowband ADC 32 of FIG. 2 and separates the narrowband data into even and odd samples, which are forwarded along separate paths to the first filter block 60 and the second filter block 62, respectively.

A data-select module 70 receives the digital wideband signal, i.e., wideband data, from the wideband ADC 42 and selectively imparts a data offset of 4×DF to the wideband data, where DF is the data Decimation Factor designated by a timing and control module (controller) 68. The resulting offset data output from the data-select module 70 is input to the first filter block 60 and the second filter block 62. Wideband data directly from the wideband ADC 42 is also directly input to the filter blocks 60, 62 so that each filter block 60, 62 has three inputs. The three inputs include one narrowband input and two wideband inputs, wherein one of the wideband inputs to each filter block 60, 62 is selectively offset by the data-select module 70. The narrowband inputs represent even and odd narrowband data samples, which are input to the first filter block 60 and second filter block 62, respectively.

The filter blocks 60, 62 receive timing and control input from the controller 68 and filter coefficients from a coefficient memory 64. The controller 68 also provides timing and control input to the data-select module 70; provides filter coefficient-selection input to the coefficient memory block 64; and provides control input to the I/Q output configuration module 66. In the present specific embodiment, the controller 68 receives configuration input from a user interface 72. Alternatively, control software running on the controller 68 may automatically generate configuration information.

Each of the filter blocks 60, 62 provide filtered I and Q signal components to the I/Q output configuration module 66. The I/Q output configuration module 66 provides selectively configured I/Q signal components to the signal processor 34 for further processing.

In operation, with reference to FIGS. 1-3, the multi-rate configurable filter 52 receives and filters narrowband input from the first ADC 32 of FIG. 2 during a first mode of operation and receives and filters wideband input from the second ADC 42 of FIG. 2 during a second mode of operation. In the present specific embodiment, the operational mode of the multi-rate configurable filter 52 is set via the controller 68, which runs algorithms to ensure that the operational mode of the filter 52 is consistent with the operational mode of the overall receiver system 50 of FIG. 2.

During the first mode of operation, the controller 68 configures the filter 52 to accommodate narrowband data as discussed more fully below. Narrowband data is sampled at or is decimated to twice the system clock rate. In the present specific embodiment, the filter 52 is implemented via a Field Programmable Gate Array (FPGA), and the system clock rate is the FPGA clock rate.

The controller 68, which acts as a timing circuit and a controller, configures the filter blocks 60, 62 for narrowband operation by selectively activating strategically placed multiplexers within the filter blocks 60, 62 so that internal MAC pipes connect serially as discussed more fully below. Furthermore, the controller 68 issues coefficient-control signals to the coefficient memory block 64. The coefficient-control signals specify address ranges, i.e., start addresses and end addresses for sets of coefficients to be applied to MAC pipes within the filter blocks 60, 62 to facilitate filtering the narrowband data in accordance with a desired transfer function, i.e., filter response. The coefficient memory block 64 forwards appropriate coefficients specified in a particular address range to the filter blocks 60, 62, as needed, which operate on even narrowband data samples and odd narrowband data samples, respectively, during narrowband mode.

During narrowband operation, filter integration lengths (also called filter lengths) associated with the filter blocks 60, 62 may be adjusted by the controller 68. For example, to reduce filter integration length, the controller 68 selectively disables certain multiplexers within the filter blocks 60, 62 to reduce the number of internal MAC pipes that are connected serially, which thereby reduces filter integration length during narrowband operation.

The even and odd narrowband input data is fed serially to the filter blocks 60, 62, sample by sample. The filter blocks 60, 62 filter the narrowband input data based on the coefficients provided by the coefficient memory block 64 and the MAC pipe configuration established via control signals from the controller 68. The filter blocks 60, 62 then provide I ($I_{FB1}$, $I_{FB2}$) and Q ($Q_{FB1}$, $Q_{FB2}$) outputs to the I/Q output configuration module 66. The I/Q output configuration module 66 combines the I/Q outputs from the filter blocks 60, 62 in various predetermined application-specific ways to yield desired filter I/Q outputs (I1, Q1, I2, Q2). In the present specific embodiment, the I/Q filter outputs based on narrowband inputs exhibit a rate of (system clock rate)/(DF), where DF is the data decimation factor of the narrowband input data from the narrowband ADC 42 of FIG. 2.

During the second mode of operation, the controller 68 configures the filter 52 to accommodate wideband data as discussed more fully below. The wideband data exhibits a sampling rate of eight times the system clock rate. The wideband data is input to the filter blocks 60, 62 and to the data-select module 70 via the wideband ADC 42 of FIG. 2. The wideband data is fed in parallel to the filter blocks 60, 62, enabling the filter blocks 60, 62 to operate on plural data samples simultaneously. The number of parallel wideband inputs is application-specific and depends on the number of I-pipes (which is equal to the number of Q-pipes) in each filter block 60, 62 as discussed more fully below.

During wideband operation, the data-select module 70 is activated. Note that during narrowband operation, the data-select module 70 need not be activated. The data-select module 70 then imparts the sample offset of four times the decimation factor, i.e., 4×DF, to the wideband data in response to an appropriate control signal from the controller 68. The resulting delayed data is input to the first and second filter blocks 60 and 62, respectively.

The controller 68 adjusts timing and control signaling to the filter blocks 60, 62 so that initiation of integration operations of circuitry processing delayed wideband data are delayed by DF/2 clocks relative to initiation of integration operations within the first filter block 60.

The controller 68 configures the filter blocks 60, 62 for wideband operation by issuing specific multiplexer-control signals to selectively activate strategically placed multiplexers within the filter blocks 60, 62 so that internal MAC pipes connect in parallel, as discussed more fully below. Furthermore, the timing and control module 68 issues appropriate coefficient-control signals specifying coefficient address ranges to the coefficient memory block 64. The coefficient memory block 64 then selectively forwards filter coefficients stored in the coefficient memory block 64 and contained within the specified ranges to the filter blocks 60, 62 as needed to implement desired filtering characteristics suitable for wideband data.

Resulting I/Q outputs from the filter blocks 60, 62 are selectively combined or interleaved by the I/Q output configuration module 66 to provide output I/Q signals suitable for a given application. The I/Q outputs from the I/Q output configuration module 66 exhibit a rate of 2×(system clock rate)/DF during wideband operation, which is twice the output rate during narrowband operation.

A user may employ the user interface 72 to load different sets of filter coefficients for use with the filter blocks 60, 62. A user may also affect coefficient start address locations and coefficient end address locations for particular filtering operations. Alternatively, coefficient selection is performed automatically via an algorithm running on the controller 68. Those skilled in the art will know how to construct an appropriate user interface to meet the needs of a given application without undue experimentation.

Figure 4:
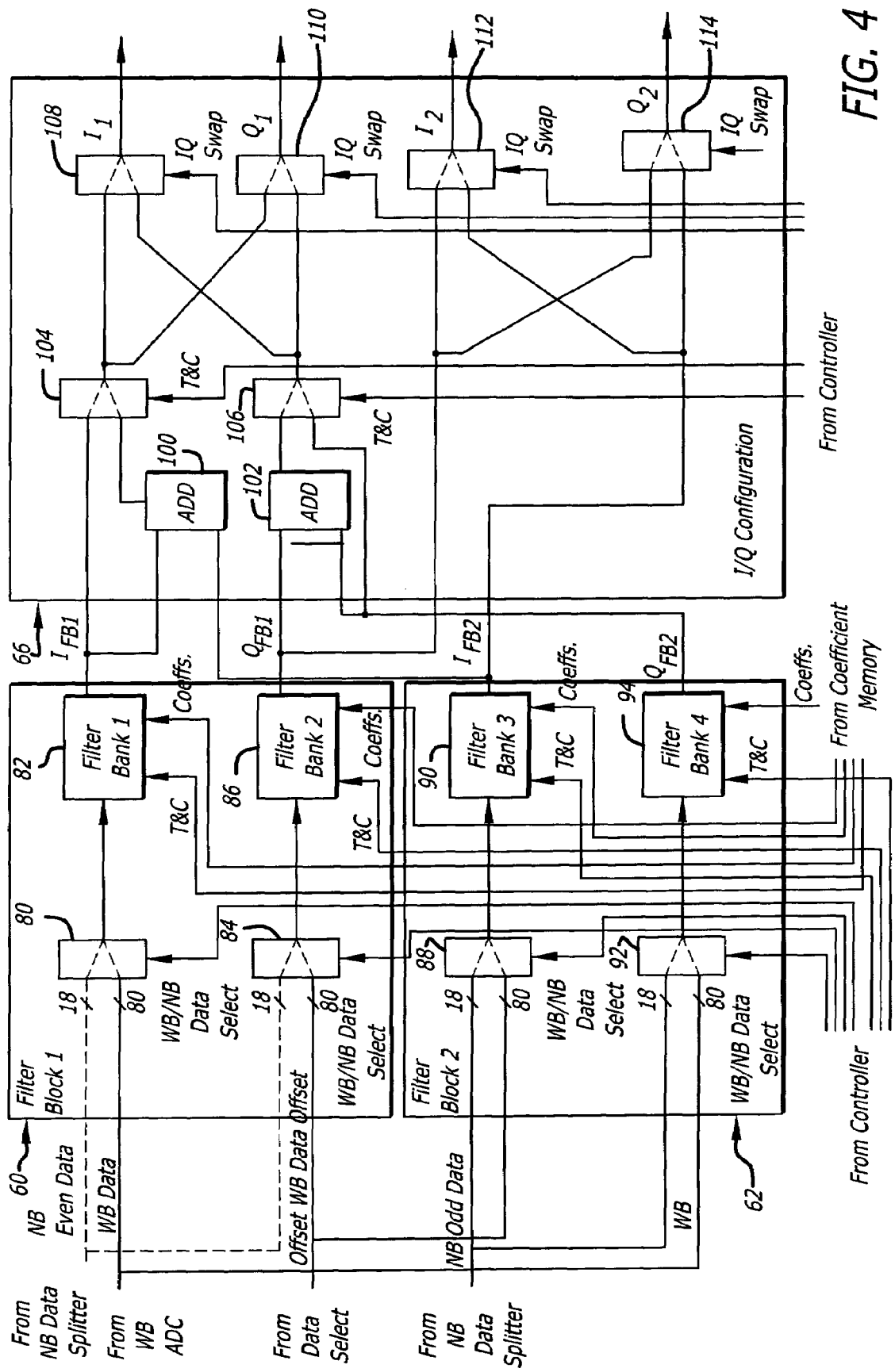
FIG. 4 is a more detailed block diagram illustrating the filter blocks and the I/Q output configuration module of FIG. 3.

FIG. 4 is a more detailed block diagram illustrating the filter blocks 60, 62 and the I/Q output configuration module 66 of FIG. 3. The first filter block 60 includes a first mode-selection Multiplexer (MUX) 80, which is connected to a first filter bank 82 and a second mode-selection MUX 84, which is connected to a second filter bank 86.

The first mode-selection MUX 80 receives wideband input data samples and even narrowband input data samples and selectively outputs these inputs in response to mode-selection control input (WB/NB Data Select) from the controller 68 of FIG. 3. The output of the first mode-selection MUX 80 is input to the first filter bank 82.

Similarly, the second mode-selection MUX 84 selectively switches its output between offset wideband input data samples and the even narrowband input data samples in response to the mode-selection control signals (WB/NB Data Select) from the controller 68 of FIG. 3. The output of the second mode-selection MUX 84 is input to the second filter bank 86.

The second filter block 62 includes a third mode-selection MUX 88, which is connected to a third filter bank 90. A fourth mode-selection MUX 92 is connected to a fourth filter bank 94 in the second filter block 62.

The third mode-selection MUX 88 selectively switches its output between the offset wideband input data samples and odd narrowband input data samples in response to mode-selection control signals from the controller 68 of FIG. 3. The output of the third mode-selection MUX 88 is input to the third filter bank 90.

Similarly, the fourth mode-selection MUX 92 selectively switches its output between the wideband input data samples and the odd narrowband input data samples in response to the mode-selection control signals from the controller 68 of FIG. 3. The output of the fourth mode-selection MUX 92 is input to the fourth filter bank 94.

The output of the first filter bank 82 represents I output ($I_{FB1}$) of the first filter block 60. The output of the second filter bank 86 represents Q output ($Q_{FB1}$) of the first filter block 60. Similarly, the output of the third filter bank 86 represents I output ($I_{FB2}$) of the second filter block 62. The output of the fourth filter bank 90 represents Q output ($Q_{FB2}$) of the second filter block 62. The first filter bank 82 and the third filter bank 90 contain so-called I MAC pipes, while the second filter bank 86 and the fourth filter bank 94 contain so-called Q MAC pipes, which are discussed more fully below.

In the present specific embodiment, the I/Q output configuration module 66 includes a first adder 100, a second adder 102, a first component-selection MUX 104, a second component-selection MUX 106, a first I/Q-swap MUX 108, a second I/Q swap MUX 110, a third I/Q swap MUX 112, and a fourth I/Q swap MUX 114.

The first adder 100 adds the output of the first filter bank 82 and the third filter bank 90 and outputs the result to the first component-selection MUX 104. The output of the first filter bank 82 is also input to the first component-selection MUX 104. The first component-selection MUX 104 selectively switches its output between the output of the first adder 100 and the output of the first filter bank 82 in response to an appropriate component-selection Timing and Control (T&C) signal from the controller 68 of FIG. 3.

The second adder 102 adds input from the second filter bank 86 to output from the fourth filter bank 94 and outputs the result to the second component-selection MUX 106. The output of the fourth filter bank 94 is also input to the second component-selection MUX 106. The second component-selection MUX 106 selectively switches its output between the output of the second adder 102 and the output of the fourth filter bank 94 in response to an appropriate component-selection control signal from the controller 68 of FIG. 3.

Outputs of the first component-selection MUX 104 and the second component-selection MUX 106 are input to the first I/Q swap MUX 108, which selectively switches its output therebetween in response to an appropriate I/Q swap signal from the controller 68 of FIG. 3. Similarly, the second I/Q swap MUX 110 selectively switches its output between outputs of the first component-selection MUX 104 and the second component-selection MUX 106 in response to an appropriate I/Q swap signal from the controller 68 of FIG. 3. In addition, the third I/Q swap MUX 112 selectively switches its output between the output of the second filter bank 86 and the output of the third filter bank 90 in response to an appropriate control signal from the controller 68 of FIG. 3. Furthermore, the fourth I/Q swap MUX 114 selectively switches its output between the output of the second filter bank 86 and the output of the third filter bank in response to an appropriate control signal from the controller 68 of FIG. 3.

In operation, with reference to FIGS. 3 and 4, during narrowband operation, which corresponds to a first mode of operation, the first mode-selection MUX 80 and the second mode-selection MUX 84 are configured to pass even narrowband data samples to the first and second filter banks 82, 86, respectively, in response to mode-selection control input from the controller 68 of FIG. 3. The first filter block 60 employs the first filter bank 82 and the second filter bank 86 to produce filtered $I_{FB1}$ and $Q_{FB1}$ outputs respectively, where the subscript 1 indicates output of the first filter block 60.

Similarly, during narrowband operation, the third mode-selection MUX 88 and fourth mode-selection MUX 92 are configured to pass odd narrowband samples to the third filter bank 90 and to the fourth filter bank 94 of the second filter block 62. The filter banks 90, 94 produce corresponding $I_{FB2}$ and $Q_{FB2}$ outputs respectively, where the subscript 2 indicates output of the second filter block 62.

During wideband operation, the mode-selection MUXs 80, 84, 88, 92 are configured to pass wideband data to the respective filter banks 82, 86, 90, 94 in response to mode-selection control signals from the controller 68 of FIG. 3. In the present specific embodiment, the filter blocks 60, 62 and the overall configurable filter 52 switch between narrowband and wideband modes of operation in a single FPGA clock cycle. Other switching rates may be employed without departing from the scope of the present invention.

In the present specific embodiment, the I/Q output configuration module 66 is selectively controlled via control signals from the controller 68 of FIG. 3 to create a desired set of I and Q outputs for a particular mode of operation. The component-selection MUXs 104, 106 enable switching between full-complex and all-real modes of operation. The I/Q configuration module is application specific and may be omitted or replaced with another module without departing from the scope of the present invention.

The I/Q configuration module 66 provides two I outputs ($I_1$ and $I_2$) and two Q outputs ($Q_1$ and $Q_2$), which are forwarded to the signal processor 34 for further processing. For narrowband data, the I/Q outputs ($I_1$, $I_2$, $Q_1$, $Q_2$) are provided at rates (system clock rate)/$DF_{NB}$, where $DF_{NB}$ is the is the narrowband decimation factor, which ranges from 1 to $N_1$, where $N_1$ depends on the size of the coefficient memory 64 of FIG. 3.

For wideband data, the I/Q outputs from both filter blocks 60, 62, when interleaved, provide an effective output rate of (2×(system clock rate)/$DF_{WB}$, where $DF_{WB}$ is the wideband decimation factor, which also depends on the size of the coefficient memory 64. Those skilled in the art will know which decimation factors to use to meet the needs of a given application.

For wideband data decimated to or sampled at eight times the system clock rate, eight consecutive data samples are fed into each filter block 60, 62. The data-select module 70 provides an input sample offset of 4×DF to wideband data input to filter blocks 60 and 62, as commanded by the controller 68. The start of the integration cycle of filter banks 86 and 90 is delayed by DF/2 system clock cycles in response to timing and control signaling from the controller 68.

The filter banks 82, 86, 90, 94 are separated into the first filter block 60 and the second filter block 62 based on whether they filter even data or odd data during narrowband operation. The first filter block 60 filters and outputs even narrowband data, while the second filter block 62 filters and outputs odd narrowband data. In the present embodiment, each of the filter banks 82, 86, 90, 94 receive timing and control input from the controller 68 of FIG. 3 and receive coefficients from the coefficient memory 64 of FIG. 3. The timing and control inputs include narrowband/wideband (NB/WB) selection inputs and integration-length inputs. The integration-length inputs specify the number of clock cycles for which accompanying MAC pipes in the filter banks 82, 86, 90, 94 will accumulate input data as discussed more fully below.

Various filter components, such as the first filter block 60 and the second filter block 62, can accommodate input data at different rates (corresponding to narrowband and wideband data) while operating at the same system clock rate, which is the FPGA clock rate in the present embodiment. As previously discussed, narrowband data is sampled by the narrowband ADC 32 of FIG. 2 at twice the system clock rate, while wideband data sampled by the wideband ADC 42 of FIG. 2 at eight times the system clock rate.

In the present specific embodiment, the center frequency of the ideal bandpass data to be filtered by the filter blocks 60, 62 is centered at ¼, ¾, ⁵⁄₄, and so on, of the sample rate. The filter blocks 60, 62 will process bandpass data exhibiting even and odd data samples that are approximately 90° out of phase, such that the samples are I/Q data streams or approximately I/Q data streams.

Figure 5:
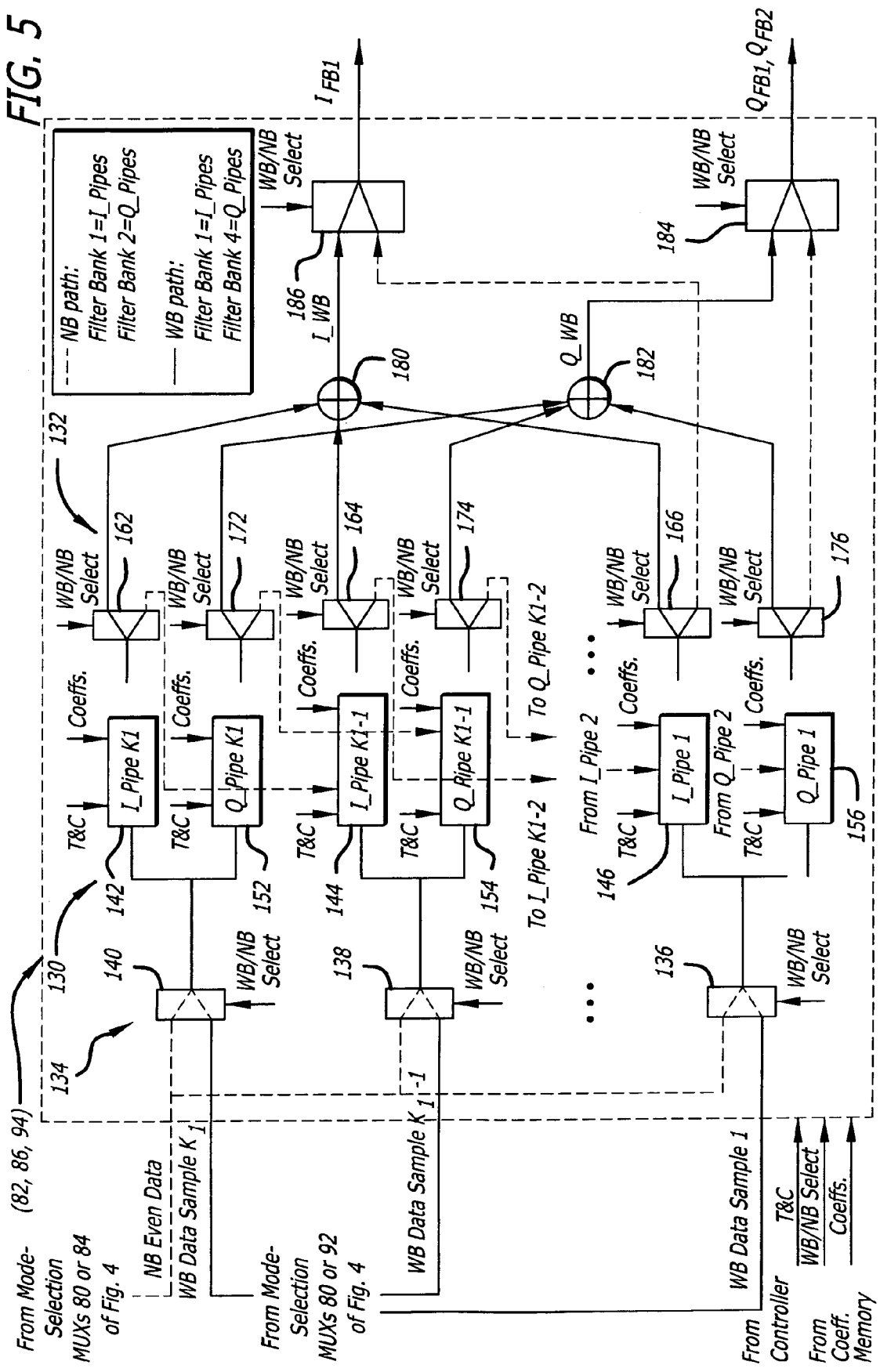
FIG. 5 is a more detailed block diagram illustrating exemplary components of filter banks of FIG. 4 including various Multiply-Accumulate (MAC) pipes.

FIG. 5 is a more detailed block diagram illustrating exemplary components of filter banks 82, 86, 94 of FIG. 4 including 2$K_1$ Multiply-Accumulate (MAC) pipes 130 and 2$K_1$ corresponding configuration-selection demultiplexers (DEMUXs) 132. With reference to FIGS. 4 and 5, FIG. 5 illustrates the requisite MAC pipe configuration for implementing the first filter bank 82 and the second filter bank 86 during narrowband operation to filter even narrowband data samples. This same MAC pipe configuration implements the first filter bank 82 and the fourth filter bank 94 during wideband operation. A similar MAC pipe configuration (not shown) implements the third filter bank 90 and the fourth filter bank 94 of FIG. 4 during narrowband operation (to filter odd narrowband data samples) and implements the third filter bank 90 and the second filter bank 86 during wideband operation.

The 2$K_1$ MAC pipes 130 are separated into pairs of I pipes and Q pipes, each pair receiving input from one of $K_1$ corresponding WB/NB-selection MUXs 134. For illustrative purposes, FIG. 5 shows three of the $K_1$ WB/NB-selection MUXs 134, including a first WB/NB-selection MUX 136, a $(K_1-1)^{th}$ WB/NB-selection MUX 138, and a $K_1^{th}$ WB/NB-selection MUX 140. In addition, FIG. 5 illustrates three of the $K_1$ I pipes, including a $K_1^{th}$ I pipe 142, a $(K_1-1)^{th}$ I pipe 144, and a first I pipe 146. The I pipes 142, 144, 146 are paired with corresponding Q pipes 152, 154, 156. The $K_1^{th}$ I pipe 142 and Q pipe 152 receive input in parallel from the $K_1^{th}$ WB/NB-selection MUX 140. The $(K_1-1)^{th}$ I pipe 144 and Q pipe 154 receive input in parallel from the $(K_1-1)^{th}$ WB/NB-selection MUX 138. Similarly, the first I pipe 146 and Q pipe 156 receive input from the first WB/NB-selection MUX 136.

The WB/NB-selection MUXs 136, 138, 140 selectively receive even narrowband data samples from the mode-selection MUX 80 or the mode selection MUX 84 of FIG. 4, which are configured to produce similar narrowband outputs during narrowband operation. The narrowband data samples are fed serially, one after the other, into the WB/NB-selection MUXs 136, 138, 140. In contrast, during wideband operation, $K_1$ different wideband samples are input in parallel to the $K_1$ WB/NB-selection MUXs 134. These parallel wideband data samples may be output from the first mode-selection MUX 80 and the fourth mode-selection MUX 92 of FIG. 4, which output similar wideband samples. In some implementations, where the wideband data does not arrive to the filter banks 82, 86, 90, 94 of FIG. 4 in parallel, a $K_1$-tap parallel shift register (not shown) may be employed to convert the serial data into requisite parallel wideband data samples.

In FIG. 5, six of the 2$K_1$ configuration-selection DEMUXs 132 are shown. The output of each I pipe 142, 144, 146 is input to a respective configuration-selection DEMUX 162, 164, 166. Similarly, the Q pipes 152, 154, 156 are input to corresponding configuration-selection DEMUXs 172, 174, 176, respectively.

During wideband operation, each wideband output of every other configuration-selection DEMUX 162, 164, and 166, is input to a first wideband adder 180. The wideband outputs of the intervening configuration-selection DEMUXs 172, 174, 176 are input to a second wideband adder 182.

During narrowband operation, the narrowband output of the first configuration-selection DEMUX 176, which is associated with the first Q pipe 156, is input to a first output-selection MUX 184. The narrowband output of the second configuration-selection DEMUX 166 is input to a second output-selection MUX 186. The first output-selection MUX 184 also receives output from the second adder 182. The second output-selection MUX 186 receives output from the first adder 180. The output of the first output-selection MUX 184 represents filtered Q data, while the output of the second output-selection MUX 186 represents filtered I data.

Each output of the remaining configuration-selection DEMUXs 132 associated with an I pipe is input to the next proximate I pipe. For example, the narrowband output of the $K_1{}^{th}$ DEMUX 162, which is associated with the $K_1{}^{th}$ I pipe 142, is input to the $(K_1-1)$th I pipe 144. Similarly, each narrowband output of the DEMUXs 132 associated with a Q pipe is input to the adjacent Q pipe. For example, the narrowband output of the $K_1{}^{th}$ DEMUX 172, which is associated with the $K_1{}^{th}$ Q pipe 152 is input to the $(K_1-1)^{th}$ Q pipe 154.

The various filter components, including the MAC pipes 130, MUXs 132, and DEMUXs 134 are responsive to timing and control input from the controller 68 of FIG. 3. Each of the MAC pipes 130 receive additional programmable coefficients as needed from the coefficient memory 64 of FIG. 3.

In operation, with reference to FIGS. 3, 4, and 5, the controller 68 of FIG. 3 configures the WB/NB-selection MUXs 134, the MAC pipes 130, the configuration-selection DEMUXs 132, the adders 180, 182, and the output-selection MUXs 184, 186 for either narrowband or wideband operation via timing and control signals. In addition, the controller 68 selectively controls memory coefficients that are output from the coefficient memory 64 to the various MAC pipes 130 via coefficient-selection signals forwarded to the coefficient memory 64 of FIG. 3.

During narrowband operation, the WB/NB-selection MUXs 134 are configured to pass even narrowband data samples to the various MAC pipes 130. The configuration-selection DEMUXs 132 at the outputs of the MAC pipes 130 are configured to connect the outputs of the MAC pipes 130 in a serial configuration so that the output of one I pipe is connected to the input of the next I pipe, and the output of one Q pipe is connected to the input of the next Q pipe.

In the narrowband serial configuration, the output of the last I pipe in the chain, which corresponds to the first I pipe 146 in FIG. 5, represents the narrowband I output of the MAC pipes 130. Similarly, the last Q pipe in the chain, which corresponds to the first Q pipe 156 in FIG. 5, represents the narrowband Q output of the MAC pipes 130. The narrowband I output of the MAC pipes 130 is switched to the output of the filter blocks 82, 86, 94 via the configuration-selection DEMUX 166 and the second output-selection MUX 186. Similarly, the narrowband Q output of the filter blocks 82, 86, 94 is switched to the output of the filter blocks 82, 86, 94 via the first configuration-selection DEMUX 184 in response to appropriate control signals from the controller 68 of FIG. 3.

With reference to FIGS. 4 and 5, during narrowband operation, the I output of the filter blocks 82, 86, 94 of FIG. 5 represents the I output ($I_{FB1}$) of the first filter bank 82 of FIG. 4. Furthermore, during narrowband operation, the Q output of the filter blocks filter blocks 82, 86, 94 of FIG. 5 represents the Q output ($Q_{FB1}$) of the second filter bank 86 of FIG. 4.

During wideband operation, the wideband I output of the filter blocks 82, 86, 94 of FIG. 5 represents the I output ($I_{FB1}$) of the first filter bank 82 of FIG. 4. However, during wideband operation, the Q output ($Q_{FB2}$) of the filter blocks 82, 86, 94 of FIG. 5 represents the Q output of the fourth filter bank 94 of FIG. 4.

During wideband operation, the WB/NB-selection MUXs 134 are configured to pass successive wideband samples to successive I/Q pairs of the MAC pipes 130. The configuration-selection DEMUXs 132 at the outputs of the MAC pipes 130 are configured to arrange the outputs of the MAC pipes 130 in a parallel configuration so that the wideband I outputs of the MAC pipes 130 are input to the first wideband adder 180, and the wideband Q outputs of the MAC pipes 130 are input to the second wideband adder 182. The resulting summed wideband I outputs, as output by the first wideband adder 180, are switched to the wideband I output ($I_{FB1}$) of the filter blocks 82, 86, 94. Similarly, the summed wideband Q outputs, as output by the second wideband adder 182, are switched to the wideband Q output ($Q_{FB2}$) of the filter blocks 82, 86, 94.

Note that the filter banks 82, 86, 90, 94 of FIG. 4 comprise different sets of MAC pipes depending on the configuration. For example, during narrowband operation, the Q pipes 152, 154, 156 represent the second filter bank 86 of FIG. 4. The I pipes 142, 144, 146 represent the first filter bank 82 of FIG. 4. During wideband operation, the Q pipes 152, 154, 156 represent the fourth filter bank 94, and the I pipes 142, 144, 146 represent the first filter bank 82.

Figure 6:
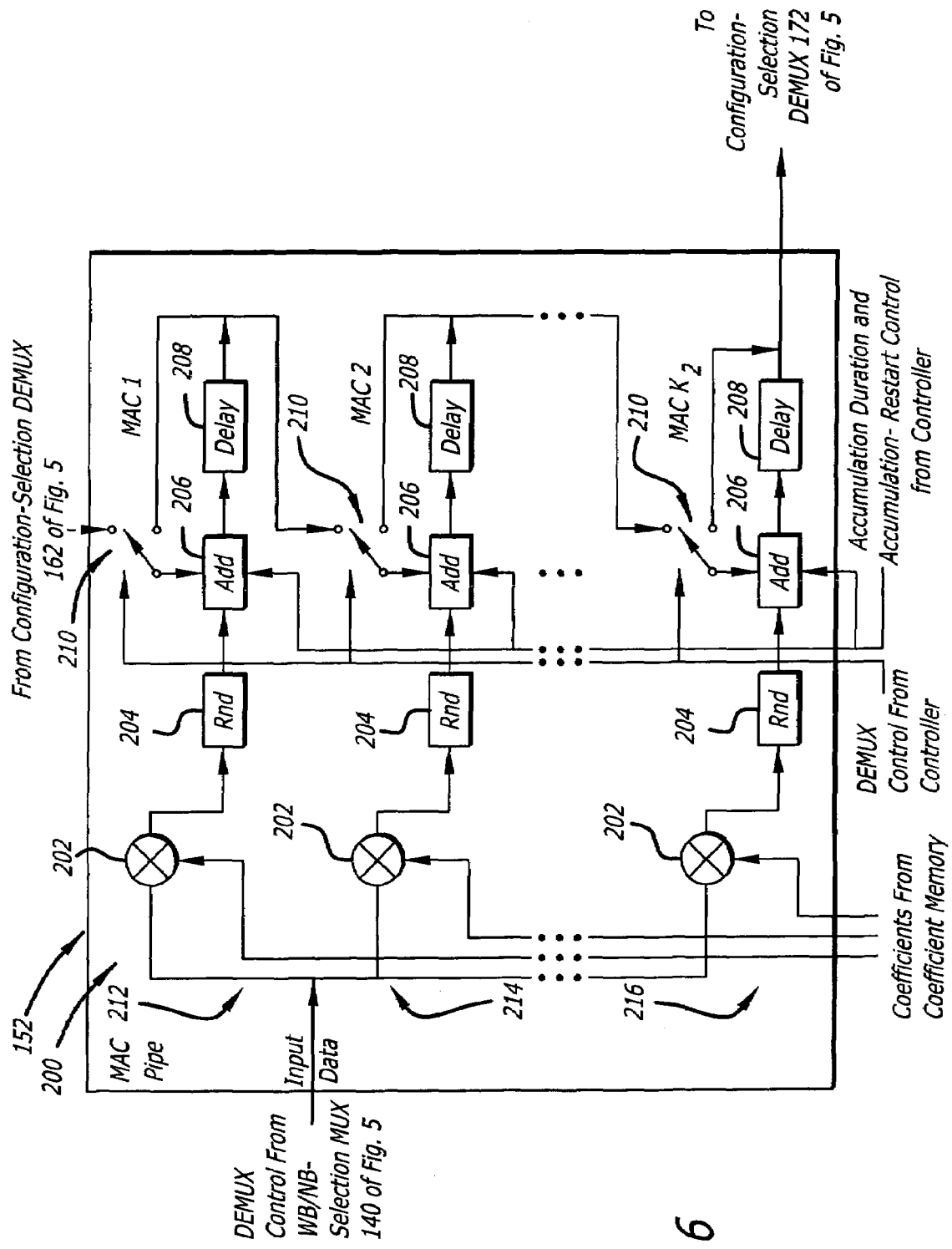
FIG. 6 is a more detailed exemplary block diagram of a MAC pipe of FIG. 5, which employs coefficients from the coefficient memory block of FIG. 3.

A different set of MAC pipes and accompanying MUXs, DEMUXs, and adders (not shown), which is similar to that shown in FIG. 6 may be employed to implement the remaining filter banks of FIG. 4. In particular, a similar set of components would be employed to implement the third filter bank 90 and the fourth filter bank 94 during narrowband operation and to implement the second filter bank 86 and the third filter bank 90 during wideband operation.

Alternatively, the component configuration shown in FIG. 6 may be employed to implement all of the filter banks 82, 86, 90, 94 of FIG. 4 by selectively switching the components of FIG. 6 from operating on the narrowband even data from the narrowband data splitter 58 of FIG. 3 and the wideband data from the from the wideband ADC 42 of FIG. 2 to operating on the remaining data paths, i.e., the narrowband odd data from the narrowband data splitter 58 of FIG. 3 and the offset wideband data from the data-select module 70 of FIG. 3. However, in this implementation, one skilled in the art may employ additional MUXs and/or memories (not shown) to facilitate producing the desired filtered I/Q outputs.

In the present specific embodiment of FIG. 6, during narrowband operation, the controller 68 of FIG. 3 may selectively control the configuration-selection DEMUXs 132 to alter the number of the MAC pipes 130 that are connected serially. This effectively controls the narrowband filter length, thereby providing an additional degree of filter configurability and applicability to different applications. A user may load different software into the controller 68 via the user interface 72 of FIG. 3 or may modify existing control software to adjust the narrowband filter length as needed for a particular application. Hence, when operating in the narrowband configuration, the MAC pipe at which a particular integration cycle is started may be determined by a user, thereby allowing the user to vary filter length and control the integration delay. Furthermore, integration lengths of individual MAC pipes 130 may also be set via the controller 68 as discussed more fully below.

In summary, when processing wideband data, each MAC pipe 130 receives a data sample. The resulting outputs are then summed via the adders 180, 182 to form I/Q output samples. When processing narrowband data, all $K_1$ I and Q pipes 130 receive the same narrowband input data. During narrowband operation, the outputs of the MAC pipes 130 are connected serially from each $(K_1)^{th}$ MAC pipe (see 142 and 152) down to the first MAC pipes (see 146 and 156) to form I/Q outputs.

FIG. 6 is a more detailed block diagram of an exemplary MAC pipe 152 of FIG. 5, which employs coefficients from the coefficient memory 64 of FIG. 3. The MAC pipe 152 includes $K_2$ MAC blocks 200, where $K_2$ is an application-specific positive integer. The parameters $K_1$ and $K_2$ are application specific and dependent on the implementation limitations of the targeted technology, such as a particular FPGA technology.

For illustrative purposes, three of the MAC blocks 200 are shown, in particular, a first MAC block 212, a second MAC block 214, and a $(K_2)^{th}$ MAC block 216. Each MAC pipe 200 includes an input coefficient multiplier 202 for multiplying input data with a desired filter coefficient. An output of the coefficient multiplier 202 is input to a rounding circuit 204, which provides input to an accumulator circuit 206. Each accumulator circuit 206 also receives accumulation-length input from the controller 68 of FIG. 3, which specifies the number of clock cycles for which the accumulators 206 should add input samples from the rounding circuit 204 with input samples from an output of a MAC-block DEMUX switch 210. Accumulation length may be specified by a user via the user interface 72 of FIG. 3.

Each accumulator 206 provides output to a delay circuit 208, the output of which is input to the MAC-block DEMUX switch 210. In the present specific embodiment, the output of each delay circuit 208 is input a subsequent MAC-block DEMUX switch 210. Each MAC-block DEMUX switch 210 selectively switches its output between the output of the delay circuit 208 associated with the current MAC block 200 and the output of an adjacent previous MAC pipe.

For example, the MAC-block DEMUX switch 210 of the first MAC block 212 selectively transfers the output of the $(K_2)^{th}$ MAC block (not shown) of the I pipe 142 of FIG. 5 or the output of the delay circuit 208 of the first MAC block 212 to an input of the accumulator 206 in response to DEMUX control signaling from the controller 68 of FIG. 3. The output of the $(K_2)^{th}$ MAC block 216 is taken from the output of the associated delay circuit 208.

The construction and operation of various conventional MAC blocks are known in the art. Those skilled in the art with access to the present teachings may readily implement suitable MAC pipes to implement embodiments of the present invention without undue experimentation.

With reference to FIGS. 4, 5, and 6, each filter bank 82, 86, 90, 94 of FIG. 4 employs $K_1$ of the MAC pipes 130 of FIG. 5 at any given time, and these MAC pipes are constructed similarly to the MAC pipe 152 of FIG. 6. Each MAC Pipe 152 contains $K_2$ MAC blocks connected in series. Rounded data values are accumulated in each MAC block 200 for a predetermined number of clocks, called the MAC integration period. At the end of this MAC integration period, the accumulated value of each MAC block 200 is transferred to and added to the accumulated value in the next MAC block in series. The MAC integration period is then restarted in each MAC block 200 simultaneously via control signaling from the controller 68 of FIG. 3.

The accumulated value of the last MAC block 216 of each MAC pipe 130 of FIG. 5 is either clocked out for further processing or can be passed into the first MAC of another MAC Pipe, which occurs during narrowband operation. The processing of narrowband/wideband data is achieved by reconfiguring the manner in which the MAC pipes 130 of FIG. 5 are connected.

This filter bank architecture of the present specific embodiment supports the filter timing and control schemes discussed in U.S. Pat. No. 5,952,947, entitled FLEXIBLE AND PROGRAMMABLE DELTA-SIGMA ANALOG SIGNAL CONVERTER, the teachings of which are hereby incorporated by reference herein. This U.S. Patent discloses an exemplary programmable delta-sigma analog-to-digital converter, which, after bandpass filtering, may be employed as narrowband data to the NB data splitter of FIG. 3.

Figure 7:
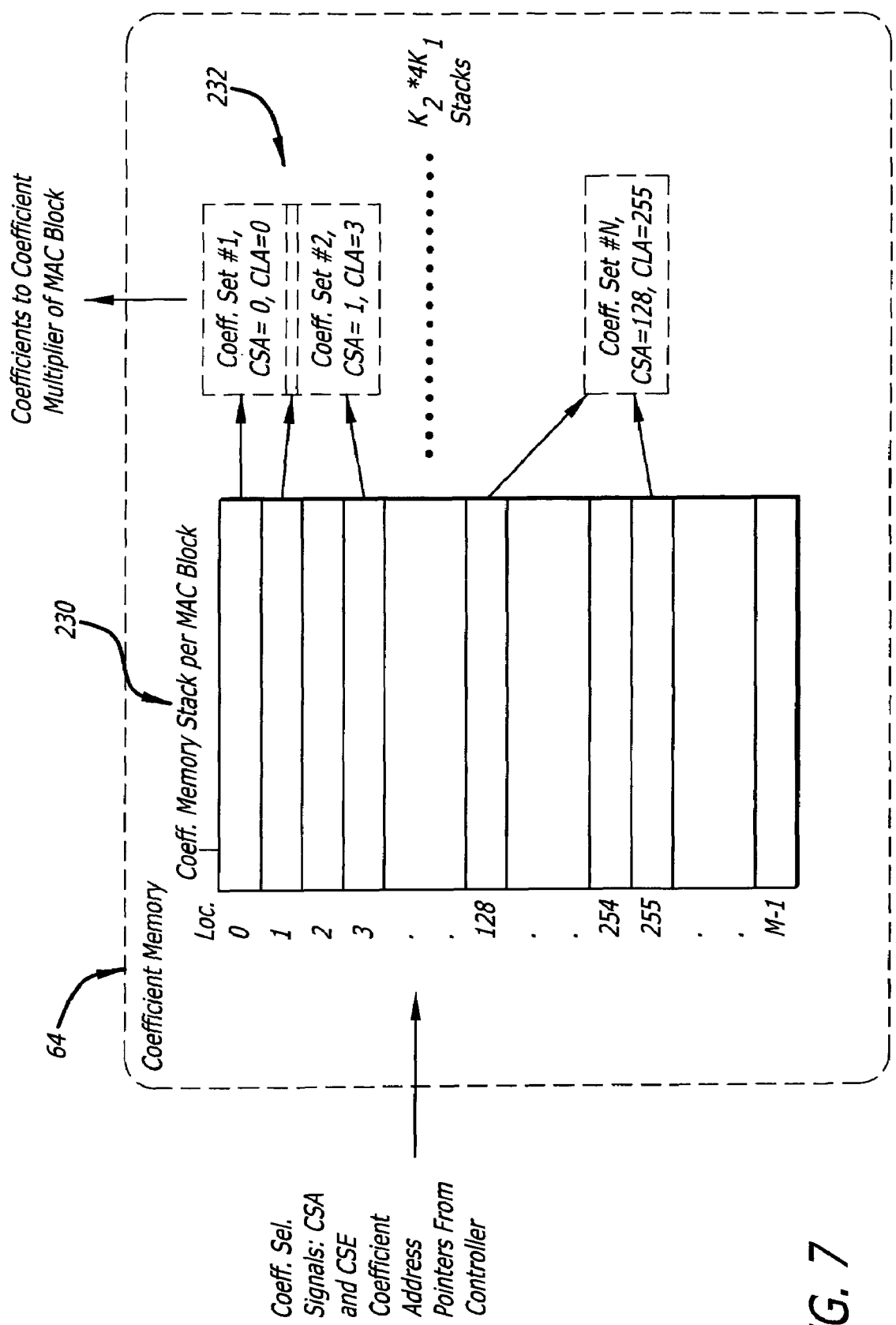
FIG. 7 is a more detailed exemplary diagram of a coefficient memory of FIG. 3.

FIG. 7 is a more detailed exemplary diagram of a coefficient memory block 64 of FIG. 3. With reference to FIGS. 3, 4, 5, 6 and 7, the coefficient memory 64 is divided into plural coefficient memory stacks 230, one stack for each MAC block 200 for each MAC pipe 130. Each filter bank of FIG. 4 employs $K_1$ MAC pipes (see FIG. 5), and each MAC pipe employs $K_2$ MAC blocks (see FIG. 6). Accordingly, the coefficient memory 64 maintains $K_2 \times 4K_1$ coefficient memory stacks 230, one stack for each MAC block. Alternatively, one coefficient memory stack 230 may be shared among all MAC blocks, since the coefficients sent to a particular MAC block are determined via address pointers as discussed more fully below.

In the present specific embodiment, each coefficient memory stack 230 accommodates M locations, where M is an integer representing the size of the coefficient memory stack allocated for a particular MAC block. Each coefficient memory stack 130 is programmable such that coefficient values at each memory location may be altered via the controller 68 and/or via a user via the user interface 72 of FIG. 3. Those skilled in the art will appreciate that the efficient memory stack 130 exhibits single-clock switching capability, such that different coefficients may be selected each clock cycle.

The exact value of M is application specific and may depend on the available memory size of the targeted FPGA technology. The number of coefficients in a set of coefficients associated with a particular MAC block is equal to the Integration Period of the MAC block (MIP). The maximum number of coefficient sets that can be pre-loaded in the coefficient memory 64 for a particular MAC block is M/MIP. Coefficient sets with different lengths may be employed as long as the sum of the lengths of all of the coefficient sets does not exceed M.

A user or an algorithm running on the controller 68 defines the Coefficient Start Address (CSA) and the Coefficient Last Address (CLA) for each set of filter coefficients. CSA and CLA are start and end pointers in each memory stack 230. The coefficients of a particular coefficient set are taken to include memory locations associated with the CLA and CSA pointers and all memory locations in the stack 230 therebetween. The CLA and CSA pointers represent coefficient-selection signals received from the controller 68 of FIG. 3.

At the start of a MAC pipe integration cycle, the CSA is used to retrieve the first coefficient for each MAC block. The coefficient address is incremented on every clock. When the CLA is reached, the address pointer resets to the CSA and the cycle continues. To switch to a different set of coefficients, new CSA and CLA values are defined by a user and/or by the controller 68 of FIG. 3. The new address pointers are used on the next clock cycle. This allows for rapid switching of coefficient sets. The coefficient memory 64 also allows new coefficient sets to be written to memory while another set is being used.

For illustrative purposes, various coefficient memory sets 232 are shown in FIG. 7. Different coefficient sets 232 may be employed for different filter operational modes, such as wideband and narrowband modes. Hence, the coefficient memory 64 acts as a shared memory that is shared between different data processing modes. Furthermore, different coefficient values may be selectively written to the coefficient memory 64 to obtain desired narrowband or wideband filtering characteristics. Hence, the coefficient memory 64 is also a programmable memory.

The programmability of the coefficient memory 64 facilitates programming the frequency response of the filter 52 of FIG. 3 to provide a desired programmable filter response. The programmability of the filter response is further enhanced via use of control signals from the controller 68 of FIG. 3, which may control not just filter coefficients but filter integration lengths and operational modes by selectively controlling switches, such as the MUXs 134 and DEMUXs 132 of FIG. 5.

The coefficient memory 64 may be implemented via a standard memory that may be partitioned in to different memory stacks. Those skilled in the art with access to the present teachings may readily implement the coefficient memory 64, such as via an FPGA memory, without undue experimentation.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. An efficient signal filter comprising:
   first means for receiving a first signal of a first type and a second signal of a second type, said first type of signal being characterized by a first rate and said second type of signal being characterized by a second rate, said first rate being a narrowband rate and said second rate being a wideband rate;
   second means including plural filter banks for selectively filtering said first signal during a first mode of operation and filtering said second signal during a second mode of operation, said plural filter banks including one or more Multiply-Accumulate (MAC) pipes, each of said one or more MAC pipes including one or more MAC block, each MAC block associated with one or more corresponding coefficient memory data structures; wherein the second means comprises a first filter block and a second filter block, each having two filter banks, one filter bank for producing I signals and another filter bank for producing Q signals;
   third means for generating control signals, said third means including a controller;
   fourth means for automatically configuring said second means to operate in said first mode of operation or said second mode of operation based on said control signals;
   fifth means for selecting coefficients from each of said one or more memory data structures to apply to each of said one or more MAC blocks, thereby selectively affecting filter signal response;
   an I/O output configuration module for selectively combining I and Q signals output by said first filter block and said second filter block into desired filter output.

2. The filter of claim 1 wherein said first signal and said second signal are digital signal.

3. The filter of claim 2 wherein said digital signals are ADC outputs.

4. The filter of claim 1 wherein said coefficients are user-definable via a user interface to said controller and wherein said controller is user-configurable via said user interface.

5. The filter of claim 4 wherein each of said one or more memory data structures is a stack and wherein said fifth means is responsive to coefficient-control signals from said controller, said coefficient-control signals indicating start addresses and end addresses for sets of coefficients to be applied to said one or more MAC blocks.

6. The filter of claim 1 wherein said narrowband rate is double a system clock rate, while said wideband rate is eight times said system clock rate.

7. The filter of claim 1 wherein said control signals include plural control signals that are input to one or more multiplexers or switches that control whether said MAC pipes are in a serial configuration or a parallel configuration corresponding to said first mode of operation or said second mode of operation, respectively.

8. The filter of claim 7 wherein said parallel configuration is adapted to filter wideband signals and wherein said serial configuration is adapted to filter narrowband signals.

9. The filter of claim 1 wherein said controller further includes sixth means for adjusting filter lengths or integration delays associated with said filter.

10. The filter of claim 9 wherein said sixth means includes one or more multiplexers or switches, which are responsive to specific control signals from said controller, said specific control signals configured to selectively switch a desired number of said multiplexers or switches to affect numbers of said MAC pipes connected in a serial configuration, thereby affecting filter integration delay during said first mode of operation.

11. The filter of claim 1 further including a data-select module responsive to control input from said controller, said data-select module including means for imparting an offset of 4×DF (input data Decimation Factor) system clock cycles to said second signal during said second mode of operation and said second signal being a wideband signal.

12. The filter of claim 11 wherein initiation of integration implemented by said second filter block is delayed by DF/2 clock cycles relative to initiation of integration implemented by said first filter block.

13. The filter of claim 12 wherein said I/Q output configuration module includes seventh means for interleaving said even and odd I/Q samples to provide an output rate of 2×(system clock rate)/DF when said filter is in said second mode of operation and to provide an output rate of (system clock rate)/DF when said filter is in said first mode of operation.

14. A digital filter comprising:
   first means for receiving a first input signal characterized by a first rate and a second input signal characterized by a second rate, said first rate being a narrowband rate, and said second rate being a wideband rate;
   second means for generating control signals;
   second means for generating control signals;
   third means for selectively configuring said digital filter to operate on said first input signal or said second input signal in accordance with a programmable filter response in response to said control signals and to provide filtered digital output signals in response thereto;
   a first filter block and a second filter block each having two filter banks, one filter bank for producing I signals, and another filter bank for producing Q signals; and
   an I/Q output configuration module for selectively combining I and Q signals output by said first filter block and said second filter block into desired filter outputs.

15. The filter of claim 14 wherein said filtered digital output signals are in-phase and quadrature signals.

16. The filter of claim 15 wherein said third means includes a programmable shared coefficient memory containing filter coefficients, said programmable shared coefficient memory being responsive to control signals from said second means and selectively configured in response thereto to facilitate filtering of said first input signal and said second input signal.

17. The filter of claim 16 further including means for customizing filter response by adjusting said filter coefficients, said means for customizing including a user interface.

18. An electronic filter comprising:
a controller;
one or more configurable filter blocks;
first means for configuring said one or more configurable filter blocks to perform different desired filtering operations on input signals of different rates via control signals from said controller, whereby said filter is adapted to handle narrowband signals in a first configuration and wideband signals in a second configuration;
a first filter block and a second filter block each having two filter banks, one filter bank for producing I signals, and another filter bank for producing Q signals; and
an I/Q output configuration module for selectively combining I and Q signals output by said filter block and said second filter block into desired filter outputs.

19. A digital filter comprising:
a narrowband data splitter capable of receiving narrowband data samples and separating said narrowband data samples into narrowband even samples and narrowband odd samples;
a wideband data-select module capable of receiving wideband data samples and providing offset wideband data samples in response thereto;
a controller capable of generating timing and control signals and coefficient-selection signals based on an operational mode of said digital filter, said operational mode including wideband mode and narrowband mode;
filter blocks adapted to filter said narrowband even samples and said narrowband odd samples during narrowband mode and to filter said wideband data samples and said offset wideband data samples during said wideband mode in response to said timing and control signals from said controller; and
a shared filter coefficient memory for selectively providing filter coefficients to said one or more filter blocks in response to said timing and control signals from said controller.

20. The filter of claim 19 wherein said digital filter includes first means for combining filtered narrowband even samples and narrowband odd samples during said narrowband mode into in-phase and quadrature signal outputs.

21. The filter of claim 20 wherein said digital filter further includes second means for combining filtered wideband data samples and offset wideband data samples during said wideband mode into In-phase (I) and Quadrature (Q) signal outputs.

22. The filter of claim 21 wherein said first means and said second means include an I/Q output configuration module.

23. The filter of claim 20 wherein said one or more filter blocks have plural multiply-accumulate pipes, each associated with filter coefficients.

24. The filter of claim 23 wherein said one or more filter blocks include one or more switches arranged to connect said plural multiply-accumulate pipes in a serial configuration during said narrowband mode and to connect said plural multiply-accumulate pipes in a parallel configuration during said wideband mode.

25. The filter of claim 24 wherein said shared filter coefficient memory includes one or more coefficient memory stacks and wherein said coefficient-selection signals generated by said controller include start address and last address information associated with a first coefficient of a coefficient set and a second coefficient of a coefficient set to be selected from said one or more coefficient memory stacks.

26. The filter of claim 19 further including a receiver system adapted for use with said filter.

27. The filter of claim 26 wherein said receiver system includes an antenna in communication with a receive chain having a wideband Analog-to-Digital Converter (ADC) for producing said wideband data samples and a narrowband ADC for producing said narrowband data samples.

28. A method for filtering a signal including the steps of:
receiving a first signal of a first type and a second signal of a second type, said first type of signal being characterized by a first rate and said second type of signal being characterized by a second rate, said first rate being a narrowband rate, and said second rate being a wideband rate;
selectively filtering said first signal during a first mode of operation and filtering said second signal during a second mode of operation with a filter; wherein the filter comprises a first filter block and a second filter block, each having two filter banks, one filter bank for producing I signals, and another filter bank for producing Q signal;
generating a control signal;
automatically configuring said filter to operate in said first mode of operation or said second mode of operation in response to said control signal;
selectively combining I and Q signal output by said first filter block and said second filter block into desired filter output using an I/Q output configuration module.

29. An efficient signal filter comprising:
first means for receiving a first signal of a first type and a second signal of a second type, said first type of signal being characterized by a first rate and said second type of signal being characterized by a second rate, said first rate being a narrowband rate and said second rate being a wideband rate;
second means including plural filter banks for selectively filtering said first signal during a first mode of operation and filtering said second signal during a second mode of operation, the plural filter banks including one or more Multiply-Accumulate (MAC) pipes, each of said one or more MAC pipes including one or more MAC blocks, each MAC block associated with one or more corresponding coefficient memory data structures;
third means for generating control signals, said third means including a controller and said control signals include plural control signals that are input to one or more multiplexers or switches that control whether said MAC pipes are in a serial configuration or a parallel configuration corresponding to said first mode of operation or said second mode of operation, respectively,
fourth means for automatically configuring said second means to operate in said first mode of operation or said second mode of operation based on said control signals; and
fifth means for selecting coefficients from each of said one or more memory data structures to apply to each of said one or more MAC blocks, thereby selectively affecting filter signal response.

30. The filter of claim 29 wherein said parallel configuration is adapted to filter wideband signals and wherein said serial configuration is adapted to filter narrowband signals.

31. An efficient signal filter comprising:
first means for receiving a first signal of a first type and a second signal of a second type, said first type of signal being characterized by a first rate and said second type of signal being characterized by a second rate, said first rate being a narrowband rate and said second rate being a wideband rate;

second means including plural filter banks for selectively filtering aid first signal during a first mode of operation and filtering said second signal during a second mode of operation, the plural filter banks including one or more Multiply-Accumulate (MAC) pipes, each of said one or more MAC pipes including one or more MAC blocks, each MAC block associated with one or more corresponding coefficient memory data structures;

third means for generating control signals, said third means including a controller;

fourth means for automatically configuring said second means to operate in said first mode of operation or said second mode of operation based on said control signals;

fifth means for selecting coefficients from each of said one or more memory data structures to apply to each of said one or more MAC blocks, thereby selectively affecting filter signal response; and sixth means for adjusting filter lengths or integration delays associated with said filter, wherein said sixth means includes said one or more multiplexers or switches, which are responsive to specific control signals from said controller, said specific control signals configured to selectively switch a desired number of said multiplexers or switches to affect numbers of said MAC pipes connected in a serial configuration, thereby affecting filter integration delay during said first mode of operation.

32. An efficient signal filter comprising:

first means for receiving a first signal of a first type and a second signal of a second type, said first type of signal being characterized by a first rate and said second type of signal being characterized by a second rate, said first rate being a narrowband rate and said second rate being a wideband rate;

second means including plural filter banks for selectively filtering said first signal during a first mode of operation and filtering said second signal during a second mode of operation; wherein the second means comprises a first filter block and a second filter block, each having two filter banks, one filter bank for producing I signals, and another filter bank for producing Q signals;

third means for generating control signals, said third means including a controller;

fourth means for automatically configuring said second means to operate in said first mode of operation or said second mode of operation based on said control signals; and an I/Q output configuration module for selectively combining I and Q signals output by said first filter block and said second filter block into desired filter outputs.

* * * * *